United States Patent [19]

Nowak et al.

[11] Patent Number: 5,182,629

[45] Date of Patent: Jan. 26, 1993

[54] INTEGRATED CIRCUIT DIE HAVING A POWER DISTRIBUTION SYSTEM FOR AT LEAST TEN-THOUSAND BIPOLAR LOGIC CELLS

[75] Inventors: Matthew M. Nowak, San Diego; Roland D. Rothenberger, Poway; Mark A. Vinson, San Diego, all of Calif.

[73] Assignee: Unisys Corporation, Blue Bell, Pa.

[21] Appl. No.: 782,019

[22] Filed: Oct. 24, 1991

[51] Int. Cl.[5] ...................... H01L 23/48; H01L 27/10
[52] U.S. Cl. .................................... 257/577; 257/499
[58] Field of Search ...................... 357/68, 71, 40, 45, 357/65

[56] References Cited

U.S. PATENT DOCUMENTS

| | | | |
|---|---|---|---|
| 4,825,276 | 4/1989 | Kobayashi | 357/40 |
| 4,947,229 | 8/1990 | Tanaka et al. | 357/45 |
| 4,951,111 | 8/1990 | Yamamoto | 357/45 |
| 4,984,058 | 1/1991 | Miyaoka et al. | 357/45 |

*Primary Examiner*—Eugene R. Laroche
*Assistant Examiner*—Viet Q. Nguyen
*Attorney, Agent, or Firm*—Charles J. Fassbender; Mark T. Starr

[57] ABSTRACT

An integrated circuit die contains a total of at least 10,000 bipolar logica cells that dissipate at least 75 watts of power. To supply such a large amount of power to the logic cells, thin sputtered power busses of 3 μm thickness overlie the logic cells; an insulating layer surrounds the power busses; openings in the insulating layer defined plating regions on the power busses; an electroplating base film lies throughout the plating regions; and, a thick plated conductor, of at least 16 μm thickness, lies on the electroplating base film. By supplying power to the bipolar logic cells via the composite structure of the thin power busses and thick plated conductors, a noise margin problem in the logic cell output signals is avoided. With 16 μm thick plated conductors, the total number of logic cells on the die can be increased until their total power dissipation reaches 75 watts. With 21 μm thick plated conductors, total die power can be increased to 100 watts.

15 Claims, 6 Drawing Sheets

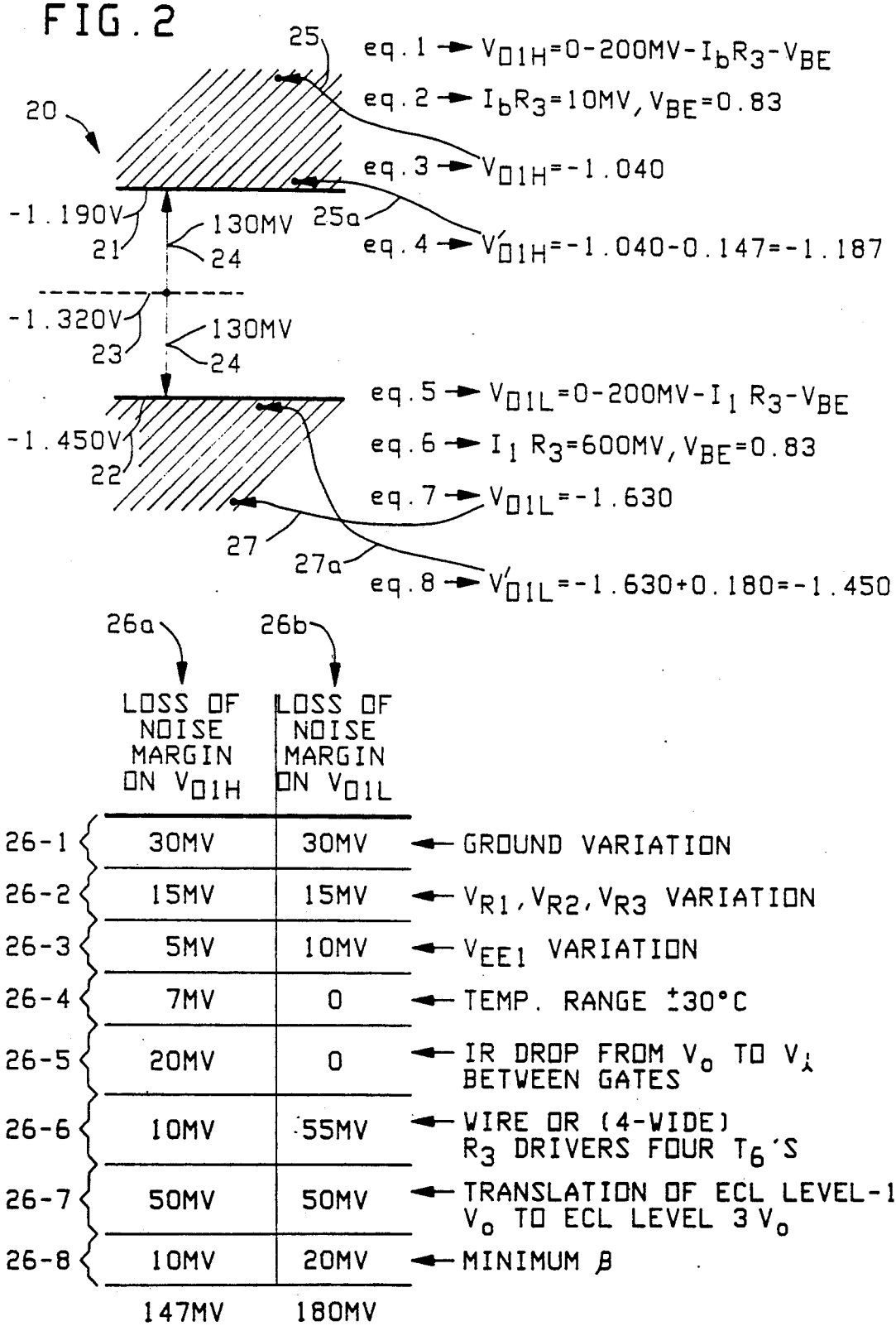

FIG. 3 eq. 30 → GROUND VARIATION = 30MV = $\Delta V_{ge} + \Delta V_{gc}$ eq. 31 → $\Delta V_{ge} \approx 20$MV eq. 32 → $\therefore \Delta V_{gc} \leq 10$mv

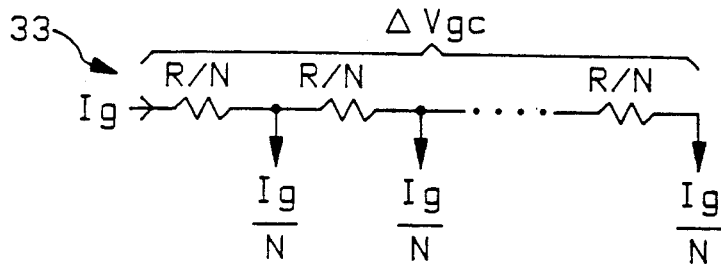

eq. 34 → $\Delta V_{gc} \approx \frac{I_g}{2}(R)$ eq. 35 → $I_g = I_1 \text{ @ } 5.2V + I_2 \text{ @ } 3.4V$ eq. 36 → $I_1 \approx I_2$ eq. 37 → $P = \left[\frac{I_g}{2}(5.2) + \frac{I_g}{2}(3.4)\right] 26$ eq. 38 → $I_g = \frac{P}{111.8}$ eq. 39 → $I_g \text{ MAX} = 1.3 I_g = \frac{P}{86}$ eq. 40 → $\Delta V_{gc} = \frac{I_g}{2}(R) = \frac{1}{2}\left(\frac{P}{86}\right)R = \frac{1}{2}\left(\frac{P}{86}\right)\rho\left(\frac{L}{Wt}\right) < 10$MV eq. 41 → $\rho = 2.44 \mu\Omega\text{-cm}, L = \frac{1.5\text{cm}}{2}, W = 500\mu m$ eq. 42 → $t = 0.212 P$ eq. 43a → $t \geq 15.9 \mu m \text{ @ } P = 75$ WATTS eq. 43b → $t \geq 21.2 \mu m \text{ @ } P = 100$ WATTS eq. 43c → IF $t = 3\mu m$ Al-Cu, $P \leq 12.2$ WATTS

INTEGRATED CIRCUIT DIE HAVING A POWER DISTRIBUTION SYSTEM FOR AT LEAST TEN-THOUSAND BIPOLAR LOGIC CELLS

BACKGROUND OF THE INVENTION

This invention relates to architectures and fabrication processes for an integrated circuit die which directly increase the maximum number of bipolar logic cells that can be placed on the die.

In the prior art, it is conventional for an integrated circuit die manufacturer to provide a digital logic cell library which contains many different types of bipolar logic cells; and, those logic cells are selected and placed on the die as needed by a user. Some typical logic cells are an N-input AND gate (where N is 2, 3, or 4), an N-input OR gate, an N-input NAND gate, an N-input NOR gate, an N-input multiplexor, a flip-flop, input-output buffers, etc.

From a user's point of view, it is very desirable to be able to put more and more bipolar logic cells on a single die, since that enables the user to build a digital logic system with fewer die. But, several well known factors limit the maximum number of cells which the die can hold. These factors are: the smallest dimensions by which the bipolar transistors in each logic cell can be patterned, the largest size to which the die can be made while still maintaining an acceptable yield, the total number of die pads that can be provided on the die for signals and power, and the degree to which heat can be removed from the die during its operation.

In the most advanced bipolar die that are commercially available die today, the smallest feature dimension is about 0.75 um, the maximum die size is about 1.0cm, the total number of die pads is about 250, and total die power is about 15 watts. On such a die, each logic cell dissipates about 2.0–20.0 milliwatts, and the total number of logic cells is about 1600. This, for example, is achieved by the Motorola MCA 10,000 ECL die which is described in the "MCA3 ECL Series Design Manual", copyrighted by Motorola, 1990.

By comparison, the present invention is for use in very high power future die where the total number of bipolar logic cells is at least 10,000 and the resulting total die power is at least 75 watts. To be able to place such a large number of cells on one die, the smallest feature dimension must be reduced to about 0.40 um–0.60 um, and the die size must be increased to about 1.5 cm on a side. Also, to be able to place so many cells on a die, the present invention addresses still another factor, which is herein called a die power distribution factor. This factor doesn't even come into effect at low power levels of about 15 watts and less; but as power levels increase, it will cause a die to fail by reducing noise margin in the logic cells.

BRIEF SUMMARY OF THE INVENTION

In accordance with the present invention, an integrated circuit die is disclosed which contains a total of at least 10,000 bipolar logic cells and dissipates at least 75 watts. To supply such a large amount of power to the logic cells, thin sputtered power busses of 3 um thickness overlie the logic cells; an insulating layer surrounds the power busses; openings in the insulating layer define plating regions on the power busses; an electroplating base film lies throughout the plating regions; and, a thick plated conductor, of at least 16 um thickness, lies on the electroplating base film.

Power is supplied to the logic cells by the composite structure of the thin power busses and thick plated conductors. With 16 um thick plated conductors, the total number of logic cells that are on the die can be increased until their total power dissipation reaches 75 watts, and noise margin of the logic cell output signals still will not be a problem. With 21 um thick plated conductors, total die power can be increased to 100 watts. By comparison, without the thick plated conductors, the total die power or maximum number of logic cells per die must be greatly reduced in order to avoid the noise margin problem. This noise margin problem and its solution by the present invention is explained in full detail in the Detailed Description.

BRIEF DESCRIPTION OF THE DRAWINGS

Various features and advantages of the invention are described herein in conjunction with the accompanying drawings wherein:

FIG. 2 is a diagram which shows how the ideal noise margin of a logic cell that is included in the FIG. 1 die is reduced by several different factors;

FIG. 3 is a set of equations which show how one of the noise margin factors in FIG. 2 is related to the thickness of certain power carrying conductors in FIG. 1;

DETAILED DESCRIPTION

Figure 1:
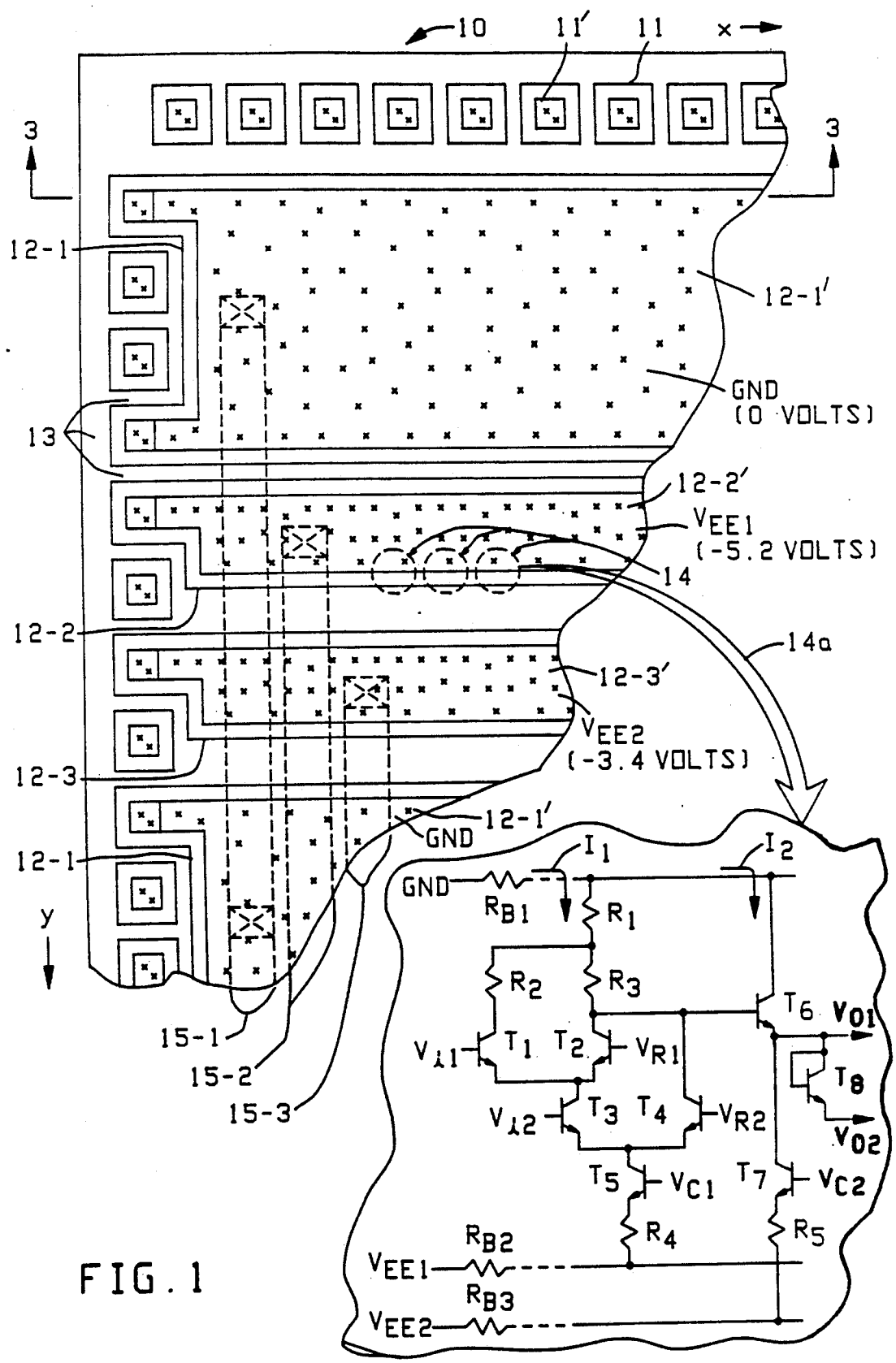
FIG. 1 is a greatly enlarged top plan view of a portion of an integrated circuit die which is structured as one preferred embodiment of the invention.

Referring now to FIG. 1, a preferred embodiment of the invention will be described in detail. In FIG. 1, reference numeral 10 indicates a corner portion of an integrated circuit die; reference numeral 11 indicates multiple die pads on the illustrated die corner; and reference numerals 12-1, 12-2, and 12-3 indicate three power busses that carry voltages GND, $V_{EE1}$, and $V_{EE2}$ respectively. The die pads 11 are disposed all around the die periphery; the power busses run across the die in the "x" direction between selected die pads; and the power busses are repeated on the die in the "y" direction.

In FIG. 1, the die pads and power busses are greatly enlarged from their real size. In actuality, each die pad 11 is 100 um × 100 um; bus 12-1 is 500 um wide; bus 12-2 is 240 um wide; and bus 12-3 is 240 um wide. Die 10 is 1.5 cm on a side, and the busses 12-1, 12-2, and 12-3 are repeated on the die thirteen times. All of the busses and die pads are etched from a single sputtered layer of aluminum-copper which is 3 um thick.

Lying on top of the power busses and die pads in the areas which are filled in with "x"s, is electro-deposited gold. This electrodeposited gold is 45 um thick, which is fifteen times thicker than the sputtered aluminum-copper die pads 11 and power busses 12-1, 12-2 and 12-3. Bonding bumps for TAB leads are formed by the gold 11', and low resistance conductors for the power busses are formed by the gold 12-1', 12-2', and 12-3'. All of the electro-deposited gold is surrounded by an insulating layer 13 of $SiO_2$.

Lying below the power busses are thousands of logic cells 14 (only three of which indicated for simplicity), as well as power bus interconnections 15-1, 15-2, 15-3. Interconnection 15-1 goes to all of the busses 12-1; interconnection 15-2 goes to all of the busses 12-2; and interconnection 15-3 goes to all of the busses 12-3. Each bus interconnection is 100 um wide and runs in the "y" direction on two sides of the die.

All of the logic cells 14 are disposed in rows in the "x" direction between the bus interconnections. Each cell is 75 um in the "y" direction, and each cell varies in the "x" direction along the row depending on the particular logic function which the cell performs. Power is supplied to several rows of cells by each set of the power busses 12-1 thru 12-3 and their overlying gold conductors 12-1' thru 12-3'.

In FIG. 1, the circuit details of one particular logic cell are indicated by reference numeral 14a. Cell 14a is comprised of five resistors $R_1$-$R_5$ and eight transistors $T_1$-$T_8$ which are interconnected as shown. Cell 14a is a two-input AND gate, and its operation—which is representative of all of the cells—is as follows.

Two logic input signals $V_{i1}$ and $V_{i2}$ are operated on by the cell. When the signals $V_{i1}$ and $V_{i2}$ are both high, a current $I_1$ is passed by transistors $T_1$, $T_3$, and $T_5$ from bus 12-1 and conductor 12-1' to bus 12-2 and conductor 12-2'. In all other cases, the current I is passed by transistor $T_2$ or $T_4$.

If the current $I_1$ passes through transistor $T_2$ or $T_4$, a voltage drop is produced across resistor $R_3$. That in turn lowers the base voltage of transistor $T_6$; and the output voltage $V_{01}$ equals this low base voltage minus the base-emitter drop through transistor $T_6$. Conversely, if the current $I_1$ passes through transistors $T_1$ and $T_3$, the voltage drop across resistor $R_3$ is removed. That in turn raises the base voltage of transistor $T_6$; and the output voltage $V_{01}$ equals this high base voltage minus the same base-emitter drop through transistor $T_6$.

Output voltage $V_{01}$ is a first level output signal which means it can be used to drive a transistor $T_1$ in another logic gate, but it cannot drive transistor $T_3$. To drive transistor $T_3$, a second level signal is needed; and, such a signal is provided by transistor $T_8$ which level shifts the output voltage $V_{01}$ to $V_{02}$.

In parallel with the current $I_1$, a second current $I_2$ passes from bus 12-1 and conductor 12-2' through the transistors $T_6$ and $T_7$ to bus 12-3 and conductor 12-3'. As the currents $I_1$ and $I_2$ flow along the power bus 12-1 and conductor 12-1' into all of the logic cells 14, they pass through a distributed resistor. This resistor is indicated in FIG. 1 as $R_{B1}$. Similarly as the currents $I_1$ and $I_2$ flow from all of the logic cells 14 through the busses 12-2 and 12-3 and conductors 12-2' and 12-3', they pass through other distributed resistors $R_{B2}$ and $R_{B3}$. Each resistor $R_{B1}$, $R_{B2}$, and $R_{B3}$ increases in resistance as the distance along the bus from the buss's die pad increases.

Due to the currents $I_1$ and $I_2$ flowing through the resistors $R_{B1}$-$R_{B3}$, voltage drops are generated. And, if the conductors 12-1' thru 12-3' were not provided, these voltage drops would increase to the point where the logic cells fail to operate properly. Exactly what this avoided failure mode is and why the conductors 12-1' the 12-3' prevent it will now be described in conjunction with FIGS. 2 and 3.

Shown in FIG. 2 at reference numeral 20 is a diagram which illustrates the allowable range of voltages for the output signal $V_{01}$. In a high state, the output signal must have a minimum value of $-1.190$ volts; and, in a low state, the output signal must have a maximum value of $-1.450$ volts. This is indicated by reference numerals 21 and 22. Between those two voltages is a mid-point or reference level 23 of $-1.32$ volts. With respect to this reference level, a noise margin 24 of 130 millivolts exists. Such a noise margin must be maintained in order for the logic cells on the die to be able to distinguish a high signal from a low signal.

Ideally, the high level $V_{01H}$ of the output voltage is given by equation 1 in FIG. 2. In equation 1, the term "0" is the ground voltage on bus 11; the term $-200$ millivolt is a voltage drop due to current $I_1$ passing thru resistor $R_1$; the term "$-I_b R_3$" is a voltage drop due to the base current of transistor $T_6$ passing thru resistor $R_3$; and the term "$V_{BE}$" is the base emitter drop in transistor $T_6$. equation 2; and, substituting those values into equation 1 yields equation 3. Equation 3 says that ideally, the high level output voltage $V_{01H}$ is $-1.040$ volts; and that voltage level is indicated by reference numeral 25.

In actuality however, the ideal high output voltage 25 is not achieved. Instead, due to various factors which are listed in column 26a of FIG. 2, the ideal high output voltage is reduced to a lower level 25a. Adding all of the factors that are listed in column 26a gives a total of 147 millivolt; and, subtracting that quantity from the ideal high voltage level 25 sets the actual output voltage 25a at $-1.187$ volts. This is given by equation 4.

Similarly in FIG. 2, an expression for the ideal value of the low level output voltage $V_{01L}$ is given by equation 5. There, the "$-200$ millivolt" term is the same $I_1 R_1$ voltage drop as discussed above; the "$-I_1 R_3$" term is a voltage drop caused by all of the current $I_1$ passing thru resistor $R_3$; and the "$-V_{BE}$" term is the base emitter drop of transistor $T_6$. Nominal values for the terms $I_1 R_3$ and $V_{BE}$ are given by equation 6; and, substituting those values into equation 5 yields equation 7. Equation 7 sets the ideal low level output voltage $V_{01L}$ at $-1.630$ volts, and that voltage level is indicated by referenced numeral 27.

Due to various factors which are listed in column 26b in FIG. 2, the ideal low level output voltage 27 is raised to a higher level 27a. Adding all of the column 26b factors together totals 180 millivolts; and adding that to the voltage level 27 sets the actual high level output voltage 27a to $-1.45$ volts. This is given by equation 8.

Eight different factors which cause the above loss of noise margin are listed in the columns 26a and 26b, and they are identified by referenced numerals 26-1 thru 26-8. Factor 26-1 is variations in the ground voltage from one location on the die to another. This ground variation is caused by the bus resistance $R_{B1}$ between different locations on the die; and, it is also caused by variations in the external ground voltage that is received by the die pads 11.

Factor 26-2 is variations in the reference voltages that occur on the die. These reference voltages vary due to process variations across the die when the die is fabricated. Two of these reference voltages are shown in FIG. 1 as $V_{R1}$ and $V_{R2}$. For a logic cell that has three series gated inputs instead of just two as in cell 14a, a third reference voltage $V_{R3}$ (not shown) also varies.

Factor 26-3 is variations in the bus voltage $V_{EE1}$. This voltage varies from one cell to another due to a voltage drop that is generated across bus resistance $R_{B2}$, and due variation in the external voltage that is applied to the die pads 11.

Factor 26-4 is variations in temperature to which the die is subjected. A suitable range for this temperature variation is $\rho\,30\tfrac{1}{2}C$.

Factor 26-5 is a voltage drop which occurs when the output signal $V_{01}$ is sent on a signal path from one logic cell to another. This voltage drop occurs due to the resistance of the signal path.

Factor 26-6 is a "wired or" configuration of the logic cells. In such a configuration, the resistor $R_3$ is connected to multiple output transistors $T_6$, and that causes an increased variation in the voltage drop $-I_bR_3$.

Factor 26-7 is variations in the output signal which occur when the output signals are translated from one series gated level to another. Signal $V_{01}$ is a first level output signal; and signal $V_{02}$ is a second level output signal. A third level output signal $V_{03}$ (not shown) is also generated from the $V_{02}$ signal. To generate each level, a transistor, such as $T_8$, is required; and each transistor has variations in its base-emitter voltage as a function of the current flowing through it.

Factor 26-8 is variations in the current gain "beta" of the transistors. Such current gain variations arise when the die is built due to unavoidable tolerances throughout the fabrication process.

Considering now FIG. 3, it contains an equation 30 which is a mathematical expression of the above described ground variation factor 26-1. In equation 30, the term $\Delta V_{ge}$ is the variation in the ground voltage that occurs external to the die 10, and the term $\Delta V_{gc}$ is a variation in ground voltage that occurs on the die due to the distributed bus resistance $R_{B1}$. Thus, the 30 millivolt factor 26-1 must be apportioned between the $\Delta V_{ge}$ and $\Delta V_{gc}$ factors. Equation 31 states that a reasonable value for $\Delta V_{ge}$ is 20 millivolts. Consequently, the voltage drop $\Delta V_{gc}$ must be no greater than 10 millivolts. This is stated by equation 32.

A circuit diagram of one ground bus 12-1 and its overlying conductor 12-1', which shows how the resistance $R_{B1}$ and the currents $I_1+I_2$ are distributed, is indicated by reference numeral 33. There, the total ground current $I_1+I_2$ is $I_g$; and the total resistance is R. That resistance is divided into N segments which are connected in series, and at the end of each segment one Nth of the ground current $I_g$ is removed to drive logic cells. With the ground current and resistance distributed in such a fashion, the total voltage drop across the entire resistance R is given by equation 34; and, it is that voltage drop which must be kept below 10 millivolts.

Next, equation 35 states that the ground current $I_g$ is comprised of the current I which passes from zero volts to $V_{EE1}$ ($-5.2$ volts), and the current $I_2$ which passes from zero volts to $V_{EE2}$ ($-3.4$ volts). Also, equation 36 states that the currents $I_1$ and $I_2$ are approximately equal in magnitude. By combining the equations 35 and 36, equation 37 is obtained which is an expression for the total power which the die dissipates. In equation 37, the factor "26" is included because as was previously stated, the busses 12-1 thru 12-3 are repeated thirteen times on the die and each bus receives current from I/O pads onto two sides of the die.

Multiplying through all of the numbers in equation 37 yields equation 38. That equation gives the ground current $I_g$ for each ground bus on the die in terms of the total die power dissipation. However, Equation 38 is correct only if the ground current $I_g$ is the same in each bus; and in an actual die, the ground currents will vary from one bus to another based on how the logic cells are distributed. Due to this nonuniform cell distribution, the maximum ground bus current may be 30% higher than the average ground bus current, and this is stated by equation 39.

Substituting equation 39 into equation 34 and expressing the resistance R in terms of its physical parameters yields equation 40. In equation 40, $\rho$ is the resistivity of conductor 12-1'; L is the length of conductor 12-1' from the I/O pads to the center of the die; W is the width of conductor 12-1'; and t is the thickness of that conductor. Values for the parameters $\rho$, L, and W are given by equation 41; and, substituting those values into equation 40 yields equation 42. It says that for a given die power dissipation P (in watts), the total thickness t (in micrometers) of the ground connector 12-1' must be at least 0.212P. And, by repeating all of the above analysis for the two other conductors 12-2' and 12-3', the same equation can be derived for them as well.

If the die dissipates 75 watts, then by equation 42 the thickness t of the plated conductors 12-1' thru 12-3' must be at least 15.9 um; and this is stated by equation 43a. If the die power dissipation is increased to 100 watts, then the thickness t must be at least 21.2 um; and this is stated by equation 43b. By comparison, if the conductors 12-1' thru 12-3'0 were eliminated and the currents $I_1$ and $I_2$ were carried by the three micron thick busses 12-1 thru 12-3, then the total die power dissipation would be limited to only 12.2 watts.

Total power dissipation of a die is directly proportional to the total number of logic cells in the die. Thus, a single 75 watt die having the FIG. 1 structure can replace six conventional 12.2 watt die, and a single 100 watt die having the FIG. 1 structure can replace eight conventional 12.2 watt die. Such replacements greatly reduce die packaging costs and circuit board costs. In addition, such replacements greatly improve system performance by eliminating die-to-die signal propagation delays.

Figure 4:
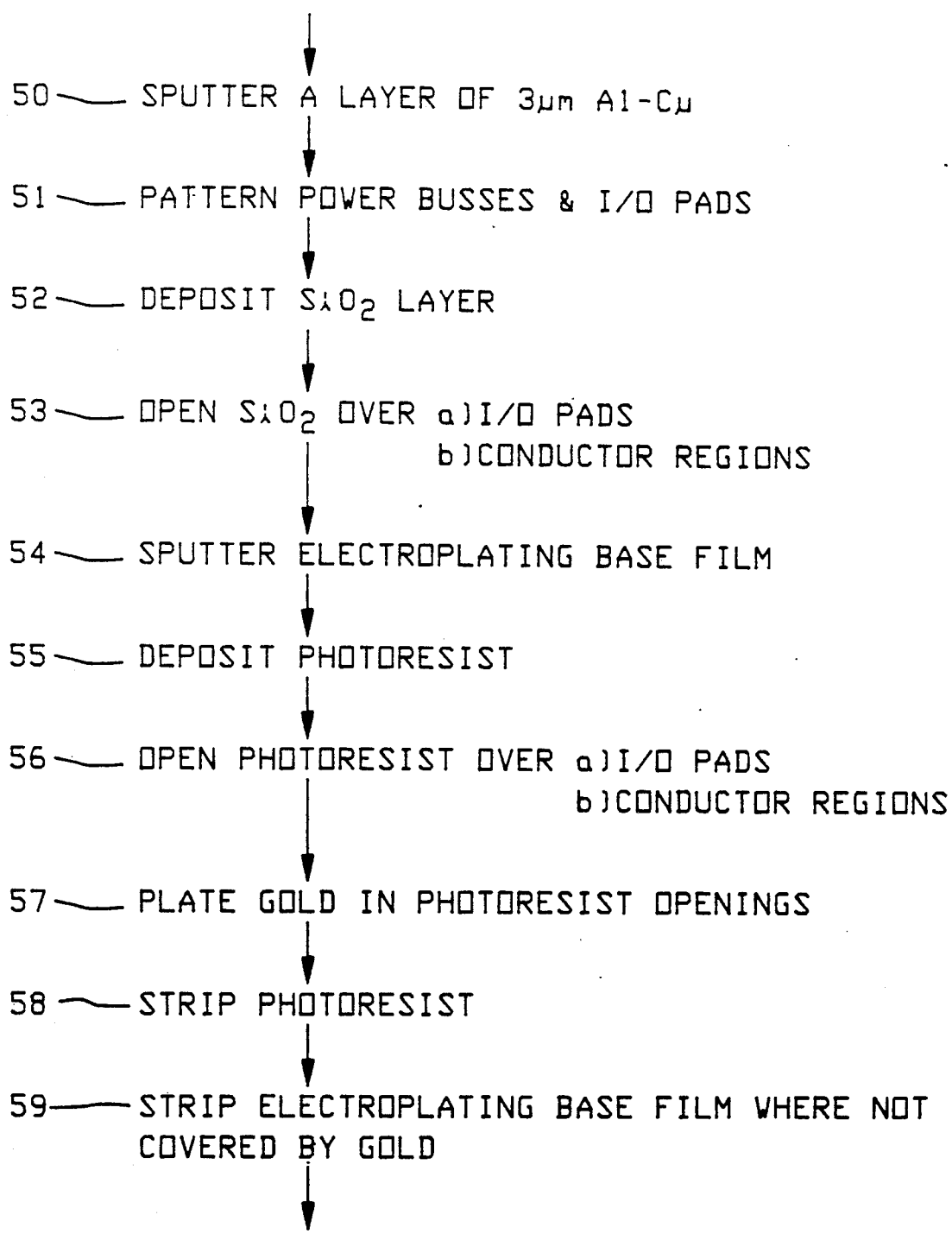
FIG. 4 shows the preferred process steps by which a FIG. 1 embodiment is fabricated.

Considering now FIG. 4, it shows the preferred process steps by which the above described die 10 is fabricated. These process steps are numbered 50 thru 59. By steps 50 and 51, the die pads 10 and the power busses 12-1 thru 12-3 are fabricated. Step 50 sputters a three micron thick layer of aluminum-copper over the entire surface of the die 10 and step 51 selectively etches that sputtered layer such that only the power busses and die pads remain.

Thereafter, by step 52, the layer 13 of $SiO_2$ is deposited on top of the die; and, by step 53, the $SiO_2$ layer is removed over the die pads and the conductor regions. These openings expose aluminum-copper in all of the chip regions which in FIG. 1 are filled with X's.

Subsequently, by step 54, an electroplating base film, such as 0.6 um of Titanium-Tungsten and 0.2 um of gold, is sputtered over the surface of the die. Thereafter, in step 55, a layer of photoresist is deposited on the electroplating base film; and by step 56, openings are formed in the photoresist over the die pads and the conductor regions. These openings in the photoresist are slightly larger than the openings that are formed by step 53, and they expose the electroplating base film in the FIG. 1 die regions which are filled with X's.

Subsequently, in step 57, gold is electro-deposited on top of the power busses and I/O pads throughout the regions where the electroplating base film is exposed. By this step, the bonding bumps 11 and the conductors 12-1' thru 12-3' are formed simultaneously. This electroplating is achieved by applying a voltage to the electroplating base film while the chip is immersed in a gold plating solution. Plating continues until the gold is at least 16 um thick. Preferably, in order to acquire a safety factor on the above described noise margin problem, the gold plating continues until the conductors 12-1' thru 12-3 are 30 um–60 um thick.

One suitable plating solution is a mixture called Neutronex 309 from Sel Rex OMI Corp. Plating occurs at room temperature with five volts applied to the electroplating base film. Under such plating conditions, gold is deposited at a rate of about one micron in three minutes. Thus a minimal thickness of 16 um is reached in less than one hour, and a preferred thickness of 30 um–60 um is reached in about 1½ hours.

By comparison, conductors having a minimal thickness 16 um and a preferred thickness of 30 um–60 um cannot be formed by sputtering. Consequently, a viable alternative to the present invention is not to simply increase the thickness of the sputtered busses 12-1 thru 12-3, and eliminate the plated conductors 12-1' thru 12-3'.

During a sputtering operation, the material that is being deposited is directed at the die in a wide pattern which is analogous to a spray painting operation. As a result, the sputtering material is deposited in a continuous film on both the silicon wafer which incorporates the die and the sputtering fixture which holds the wafer. Thus, as the thickness of this film increases, the wafer becomes bound to the fixture. To avoid such binding, sputtered films in integrated circuits are limited in thickness to about 3 um.

In addition, it is impractical to sputter 16 um and 30 um–60 um thick conductors for cost reasons. A typical sputtering machine costs 1 million–1.4 million dollars, whereas typical plating equipment costs about only fifty-thousand dollars. Thus the difference in this equipment costs is over 900,000 dollars. Also, in a sputtering machine only about 40% of the material being sputtered lands on the wafer and the remaining 60% is wasted; whereas in an electroplating operation very little material, if any, is wasted.

After the plating operation is complete, all of the photoresist is stripped from the die, and then the electroplating base film is stripped from the die where it is not covered by the electroplated gold. These steps, 58 and 59, complete the fabrication process.

Figure 5:
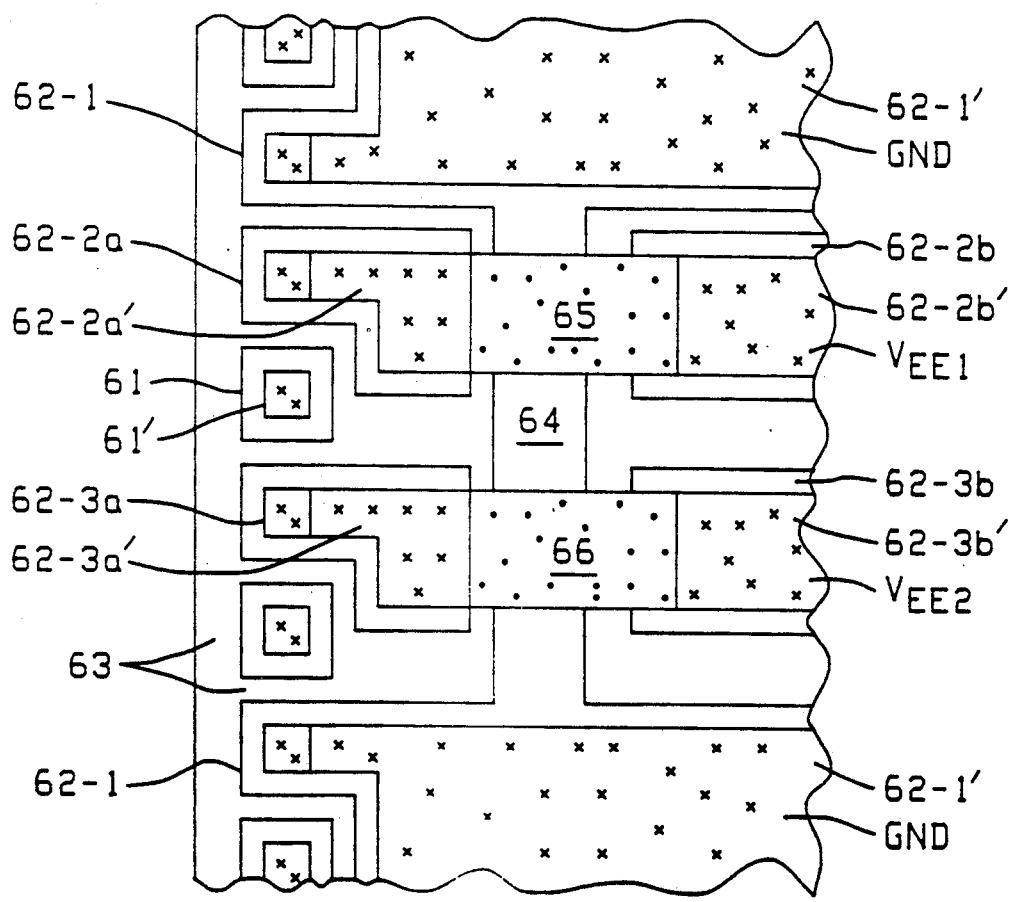
FIG. 5 is a greatly enlarged top plan view of a second embodiment of the invention; and, FIG. 6 is a greatly enlarged top plan view of a third embodiment of the invention.

Turning now to FIG. 5, the details of another embodiment of the invention will be described. Item 61 is a die pad, and it corresponds to pad 11 in FIG. 1. Item 62-1 in FIG. 5 is a ground bus, and it corresponds to bus 12-1 in FIG. 1. Items 62-2a and 62-2b are portions of a $V_{EE1}$ bus, and they correspond to bus 12-2 in FIG. 1. Items 62-3a and 62-3b are to portions of a $V_{EE2}$ bus, they correspond to bus 12-3 in FIG. 1. All of these items are 3 um thick aluminum-copper. Item 62-1' is a plated gold conductor on the ground bus. Items 62-2a' and 62-2b' are plated gold conductors on the $V_{EE1}$ bus. Items 62-3a, and 62-3b' are plated gold conductors on the $V_{EE2}$ bus. All of these items are 45 um thick.

Also in the FIG. 5 embodiments, the ground busses 62-1 are connected together by a bus interconnector 64. That interconnector 64 is etched from the same aluminum copper layer as are items 62-1, 62-2a, 62-2b, 62-3a, and 62-3b. Consequently, to provide a route for the interconnector 64, a space is provided between the bus portions 62-2a and 62-2b; and a similar space is provided between the bus portions 62-3a, and 62-3b.

Further included in the FIG. 5 embodiment are items 65 and 66. They are 45 um thick gold conductors that are plated on top of the SiO2 layer that is formed by steps 52 and 53 in the FIG. 4 process. Conductors 65 and 66 lie on the SiO2 layer throughout the regions which in FIG. 5 are filled with dots. Those portions of the SiO2 layer on which the conductors 65 and 66 lie are bridge sections that cover the interconnector 64 and prevent shorts to it.

One feature of the FIG. 5 embodiment is that the aluminum-copper layer, from which the busses 62-1, 62-2a, 62-2b, 62-3a, and 62-3b are etched, is the lowest metal layer used to distribute the ground, $V_{EE1}$, and $V_{EE2}$ voltages. Consequently, all lower metal layers are available in their entirety to interconnect logic cells. By comparison, in the FIG. 1 embodiment, the bus interconnections 14-1, 14-2, and 14-3 utilize a portion of a metal layer that lies below the power busses, and that leaves less metal to interconnect the logic cells.

Figure 6:
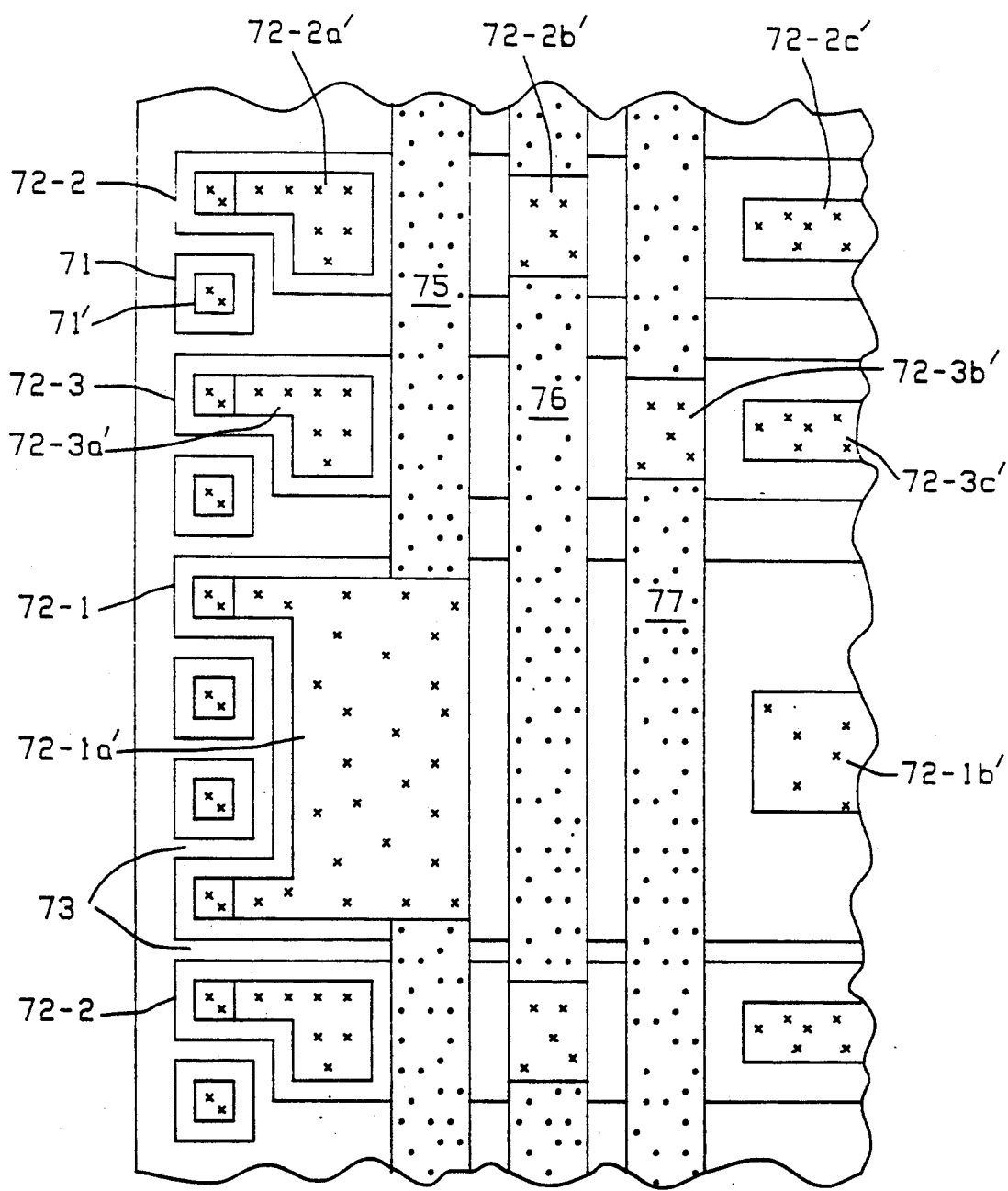

Considering next FIG. 6, the details of still another embodiment of the invention will be described. Item 71 in FIG. 6 is a die pad which corresponds to pad 11 in FIG. 1; item 72-1 in FIG. 6 is a ground bus which corresponds to bus 12-1 in FIG. 1; item 72-2 is a $V_{EE1}$ bus which corresponds to bus 12-2 in FIG. 1; and item 72-3 is a $V_{EE2}$ which corresponds to bus 12-3 in FIG. 1. All of the die pads and power busses 71, 72-1, 72-2 and 72-3 are etched from a 3 um thick aluminum-copper layer.

Also in FIG. 6, all of the regions which are "x" filled, are 45 um thick plated gold conductors that lie on power busses. These are regions 72-1a, 72-2b, 722c 2c, 73-3a, 73-3b, and 73-3c.

Item 73 in FIG. 6 is a patterned SiO2 layer, and it surrounds the regions that are filled with x's. Lying on the insulating layer 73 are other regions 75, 76 and 77 which are filled with dots; and those dot filled regions are 45 um thick plated gold conductors.

One feature of the FIG. 6 embodiment is that all of the power busses which carry like voltages are coupled together via the plated conductors 75, 76, and 77 respectively. By comparison, in the preceding FIG. 5 embodiment, only the ground busses are interconnected.

Another feature the FIG. 6 embodiment is is that plated gold conductors 72-1b, 72-2c and 72-3c which run in the x direction across the die are only half the width of the underlying power busses. Due to this width reduction, a 100% saving in gold is achieved; and at the same time, the power bus voltage drop is kept small enough to meet equation 33 of FIG. 3.

To see how equation 33 is met with the reduced width of conductor 72-1b, recall that in equation 41, the width W was 500 um, and that yielded equation 43a which said t had to be at least 15.9 um for a 75 watt chip. But in the FIG. 6 embodiment, t is 45 um, and consequently, W can be cut in half.

Three preferred embodiments of the invention, as well as a process for fabricating those embodiments, have now been described in detail. In addition, however, various changes and modifications can be made to these details without departing from the nature and spirit of the invention.

For example, the thick conductors 12-1' thru 12-3' can be plated of metals other than gold. Suitable alternative plating metals are copper, nickel, and solder alloys. These materials will increase the resistivity in equation 40, but that equation will still be met by maintaining the thickness t in the preferred range of 30 um–60 um.

Also, as another modification, some or all of the logic cells which are on the die 10 can be comprised of CMOS transistors instead of just the bipolar transistors of cell 14a. In other words, the die 10 can be a BiCMOS die; or it can be a CMOS die.

As still another modification, the thick conductors 12-1' thru 12-3' can be plated in their entirety on insulating layers such as $SiO_2$. With this modification, the underlying thin sputtered busses 12-1 thru 12-3 are eliminated, and the thick plated conductors 12-1' thru 12-3' are structured just like the dot-filled regions 65, 66, 75, 76, and 72 of FIGS. 5 and 6.

Accordingly, it is to be understood that the invention is not limited to the details of the preferred embodiments, but is defined by the appended claims.

What is claimed is:

1. An integrated circuit die which is comprised of:
   at least ten-thousand logic cells that are integrated into said die;
   thin power busses that overlie and supply power to said logic cells;
   an insulating layer which surrounds said power busses and which has elongated openings that expose major portions of said power busses to there define plating regions;
   a plating film on said power busses throughout said plating regions; and,
   thick plated conductors on said plating film throughout said plating regions.

2. An integrated circuit die according to claim 1 wherein said thick plated conductors are at least sixteen micrometers thick.

3. An integrated circuit die according to claim 2 wherein said thick plated conductors are 30 micrometers to 60 micrometers thick.

4. An integrated circuit die according to claim 3 wherein said thick plated conductors and thin power busses carry at least 75 watts of power to said logic cells.

5. An integrated circuit die according to claim 4 wherein said thick plated conductors consist essentially of gold, copper, nickel, or solder.

6. An integrated circuit die according to claim 5 wherein said power busses include first, second, and third busses; wherein said insulating layer has a bridge section that overlies said first bus; and wherein said plating film and thick plated conductors extend from said second bus over said bridge section to said third bus.

7. An integrated circuit die according to claim 5 wherein said power busses include first and second busses; wherein said insulating layer has a bridge section that overlies said first bus; and wherein said plating film and thick plated conductors extend from said second bus over said bridge section to a die pad.

8. An integrated circuit die according to claim 5 wherein said thick plated conductors are substantially narrower than said busses.

9. An integrated circuit die according to claim 1 wherein said thick plated conductors are 30 micrometers to 60 micrometers thick.

10. An integrated circuit die according to claim 1 wherein said thick plated conductors and thin power busses carry at least 75 watts of power to said logic cells.

11. An integrated circuit die according to claim 1 wherein said thick plated conductors consist essentially of gold, copper, nickel, or solder.

12. An integrated circuit die according to claim 1 wherein said power busses include first, second, and third busses; wherein said insulating layer has a bridge section that overlies said first bus; and wherein said plating film and thick plated conductors extend from said second bus over said bridge section to said third bus.

13. An integrated circuit die according to claim 1 wherein said power busses include first and second busses; wherein said insulating layer has a bridge section that overlies said first bus; and wherein said plating film and thick plated conductors extend from said second bus over said bridge section to a die pad.

14. An integrated circuit die according to claim 1 wherein said thick conductors are substantially narrower than said busses.

15. An integrated circuit die which is comprised of: a plurality of logic cells; an insulating layer over said logic cells; said insulating layer having opening that define plating regions; a plating film throughout said plating regions; and, plated conductors on said plating film throughout said plating regions which are at least fifteen micrometers thick and carry at least seventy-five watts of power to said logic cells.

* * * * *